United States Patent
Damm et al.

(10) Patent No.: US 10,781,133 B2
(45) Date of Patent: Sep. 22, 2020

(54) SCRATCH-RESISTANT GLASS OR GLASS CERAMIC ARTICLES

(71) Applicant: SCHOTT AG, Mainz (DE)

(72) Inventors: Thorsten Damm, Nieder-Olm (DE); Christian Henn, Frei-Laubersheim (DE)

(73) Assignee: SCHOTT AG, Mainz (DE)

( * ) Notice: Subject to any disclaimer, the term of this patent is extended or adjusted under 35 U.S.C. 154(b) by 217 days.

(21) Appl. No.: 14/846,287

(22) Filed: Sep. 4, 2015

(65) Prior Publication Data

US 2015/0376056 A1   Dec. 31, 2015

Related U.S. Application Data

(63) Continuation of application No. PCT/EP2014/054059, filed on Mar. 3, 2014.

(30) Foreign Application Priority Data

Mar. 6, 2013 (DE) .................. 10 2013 102 221

(51) Int. Cl.
*C03C 17/22* (2006.01)
*C03C 17/00* (2006.01)
(Continued)

(52) U.S. Cl.
CPC .......... *C03C 17/225* (2013.01); *C03C 17/002* (2013.01); *C03C 17/245* (2013.01); *C03C 17/3435* (2013.01); *C23C 14/3485* (2013.01); *C23C 14/35* (2013.01); *C03C 2217/281* (2013.01); *C03C 2217/78* (2013.01); *C03C 2218/156* (2013.01)

(58) Field of Classification Search
None
See application file for complete search history.

(56) References Cited

U.S. PATENT DOCUMENTS

| 4,957,604 A | 9/1990 | Steininger |
| 2003/0104253 A1* | 6/2003 | Osawa ................... G11B 5/656 428/831 |

(Continued)

FOREIGN PATENT DOCUMENTS

| DE | 102007033338 A1 | 1/2009 |
| DE | 102010032892 B3 | 12/2011 |

(Continued)

OTHER PUBLICATIONS

English translation of International Search Report dated Aug. 11, 2014 for corresponding PCT/EP2014/054059.

(Continued)

*Primary Examiner* — Elizabeth A Robinson
*Assistant Examiner* — Nicole T Gugliotta
(74) *Attorney, Agent, or Firm* — Ohlandt, Greeley, Ruggiero & Perle, L.L.P.

(57) ABSTRACT

A scratch-resistant amorphous and transparent AlSiN cover layer on a glass or glass ceramic substrate is provided. The cover layer has a low surface roughness and has sliding properties with respect to pots and other items. The cover layer is transparent in the visible light range and also largely transparent in the infrared range and has good chemical resistance to salted water burn-in.

12 Claims, 7 Drawing Sheets

(51) Int. Cl.
*C03C 17/245* (2006.01)
*C03C 17/34* (2006.01)
*C23C 14/34* (2006.01)
*C23C 14/35* (2006.01)

(56) References Cited

U.S. PATENT DOCUMENTS

2010/0086775 A1* 4/2010 Lairson ............... F21V 7/22
  428/336
2010/0304090 A1* 12/2010 Henn ............... C03C 17/002
  428/172
2012/0212826 A1* 8/2012 Henn ............... C03C 17/3435
  359/586

FOREIGN PATENT DOCUMENTS

| EP | 0233062 A2 | 8/1987 | |
| EP | 0327888 * | 8/1989 | ............ C23C 14/06 |
| EP | 0327888 A2 | 8/1989 | |
| EP | 1705162 A1 | 9/2006 | |

OTHER PUBLICATIONS

English translation of International Preliminary Report on Patentability dated Sep. 8, 2015 for corresponding PCT/EP2014/054059, 6 pages.
English translation of Written Opinion of the International Searching Authority dated Aug. 11, 2014 for corresponding PCT/EP2014/054059, 5 pages.

* cited by examiner

SCRATCH-RESISTANT GLASS OR GLASS CERAMIC ARTICLES

CROSS REFERENCE TO RELATED APPLICATIONS

This application is a continuation of International Application No. PCT/EP2014/054059 filed Mar. 3, 2014, which claims benefit under 35 U.S.C. § 119(a) of German Patent Application No. 10 2013 102 221.9 filed Mar. 6, 2013, the entire contents of both of which are incorporated herein by reference.

BACKGROUND

1. Field of the Invention

The invention relates to a scratch-resistant glass or glass ceramic articles and to a method for producing such scratch-resistant surfaces.

2. Description of Related Art

A magneto-optical storage medium is known from EP 0 233 062 A2 and comprises, inter alia, a glass substrate, thereon a protective layer, thereon the magneto-optical memory layer, and thereon another protective layer. The protective layer comprises the components Si, Al, O, and N in a variety of compounds, including AlSiN and AlN.

The production of a thin X-ray amorphous aluminum-nitride or aluminum-silicon nitride cover layer is disclosed in U.S. Pat. No. 4,957,604, wherein processing parameters for the sputtering method are specified.

In the context of the present application, the definition of "glass article" should also include glass ceramic articles, especially glass ceramic plates for cooktops. Further applications comprise glass panes that are subjected to high thermal loads, such as fireplace or oven windows, and to panes that are moreover exposed to very low temperatures, such as windows of vehicles, aircraft or ships. Another application field comprises scratch-resistant viewing windows and covers, for example for scanner cash registers or similar equipment, where items are slid over a viewing window.

EP 1 705 162 A1 discloses a very hard, two-phase coating as a matrix of a crystalline substance and an amorphous substance, which are simultaneously deposited on a substrate and are therefore intimately mixed. The layer is transparent at least to visible light. The amorphous substance is silicon nitride $Si_3N_4$. Mentioned crystalline substances include aluminum nitride AlN, boron nitride BN, gallium nitride GaN, and indium nitride InN, and their alloys. The layers have a low expansion coefficient, resulting in cracking and delamination phenomena when applied on thermally strongly expanding substrates, such as window glass.

DE 10 2007 033 338 B4 discloses a glass or glass ceramic article coated with hard material, comprising a glass substrate or glass ceramic substrate on which a silicon nitride layer is deposited, which has an X-ray amorphous morphology in volume. The silicon nitride layer is deposited by sputtering at a power of >10 watts/cm², preferably at least 12 watts/cm² target surface area. The silicon nitride layer may be doped with 5 to 10 at % aluminum in the silicon. Vickers hardness levels between 2000 and 3000 were measured. However, in practice it was found that the coating is not satisfactory chemically stable. This shortcoming manifests itself in the application as a protective layer of a cooktop when salted water gets on the surface and is evaporated at 400 to 600° C. SiN bonds are broken and sites with SiO are resulting, where Na ions may be linked, leading to a noticeable change in appearance of the layer in case of this burn-in of water. Another drawback of the Al-doped layer is the risk of delamination when applied to a substrate with a relatively high coefficient of thermal expansion (CTE) relative to the low coefficient of thermal expansion of the doped layer.

Although great hardnesses can be achieved with SiN coatings, also when doped with AlN, it becomes clear when viewed under an electron microscope that the surfaces have a rough texture. Such surfaces appear dull, and items cannot easily be slid over such cover layers. This is reflected in an increased static friction. This is a disadvantage for cooktops for shifting pots or for scanner cash registers for sliding items thereover.

SUMMARY

The object of the invention is to provide a transparent scratch-resistant coating with a better chemical resistance to salted water burn-in compared to the prior art coatings discussed above and with better sliding properties with respect to the items slid thereover. The transparent, scratch-resistant coating should moreover adhere better to substrates selected from a great variety of glasses. Compared to SiN layer systems, scratch protection should be further improved.

According to the invention, an AlSiN cover layer is applied on a glass or glass ceramic substrate using a deposition method. The cover layer consists of an amorphous, in particular X-ray amorphous AlSiN layer with an Al:Si mixing ratio in a range from 20:80 to 95:05 at %, preferably from 40:60 to 85:15 at %, and most preferably from 50:50 to 75:25 at %. A surface roughness of Ra<1.5 nm, better Ra<1.0 nm is met. Hereby the desired sliding properties for items slid over the cover layer are achieved and, moreover, good scratch protection is obtained.

In addition to a pure AlSiN layer, a AlSiN cover layer also refers to a layer which may comprise further layer components to a smaller extent. In particular such a layer may be a nitride layer in which Si and Al predominate compared with further optional components. Preferably, Al and Si represent at least ⅔ of the nitridic components of the layer, based on the molar amounts.

A scratch-resistant glass article according to the invention may be provided in form of a glass ceramic plate for cooktops, or as a glass window for fireplaces and ovens as well as for vehicles, aircraft or ships, or in form of a cover of scanner cash registers, or in form of a viewing window or a cover of a display. Such displays may especially also be touch displays, as used, inter alia, in mobile phones, tablet computers and other handheld electronic devices. In this case, the cover layer according to the invention provides high scratch and wear resistance.

As such, various deposition methods such as CVD, PVD and sol-gel processes may be used to produce an AlSiN cover layer. Preferably, however, a sputtering process is used, in particular the high power impulse magnetron sputtering (HiPIMS) process, also known as high power pulsed magnetron sputtering (HPPMS) process. This method allows for high power densities on the target of at least 100 watts/cm² target surface area. A preferred power range is from 100 to 2000 watts/cm². The repetition frequency of the pulses is in a range from 500 Hz to 10 kHz. The pulses may as well be emitted as pulse trains between pulse pauses. Optionally, an electrical voltage of several 100 volts may be maintained between target and substrate during the pulse pauses after the pulse trains, which may be a DC voltage or an AC voltage, in order to maintain the plasma in the sputtering apparatus. The processing pressure in the sputtering apparatus is kept at a relatively low value (typically $5\times10^{-3}$ mbar), which in conjunction with the measures discussed results in a very dense and smooth texture of the deposited AlSiN layer.

DESCRIPTION OF THE DRAWINGS

Exemplary embodiments of the invention will be described with reference to the drawings, wherein.

DETAILED DESCRIPTION

Figure 1:
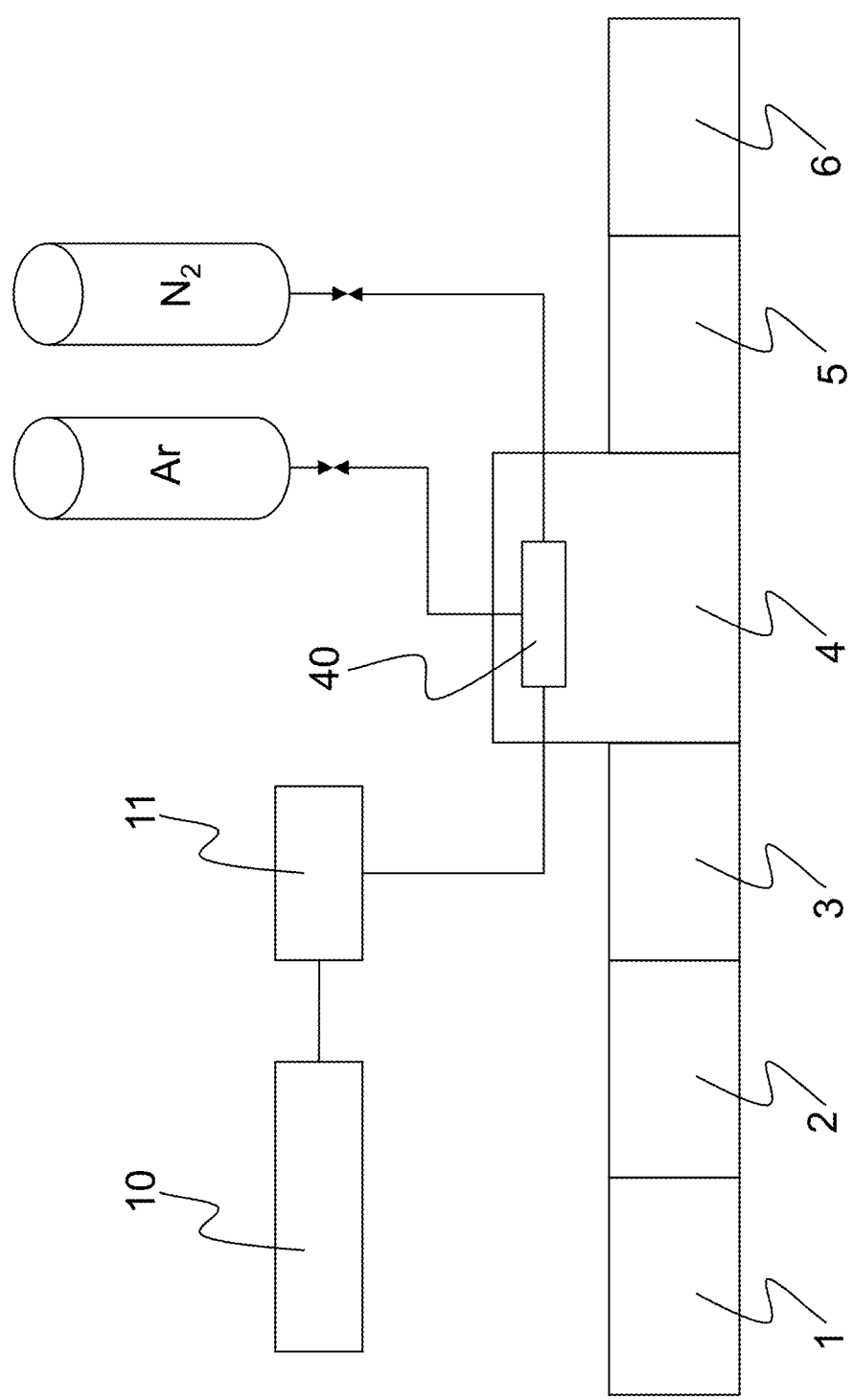
FIG. 1 shows a sputtering apparatus for producing the cover layer according to the invention.

FIG. 1 schematically illustrates a sputtering apparatus. Transfer equipment passing through the apparatus is provided, which is loaded with substrates at loading device 1. The substrates reach a lock-in chamber 2 which is evacuated to vacuum level ($<1\times10^{-4}$ mbar). Subsequently, the substrate is transported into a heating chamber 3 which is also evacuated, and remains there at a defined temperature (e.g. 300° C.) for a predetermined period of time. Thereafter, the substrate is placed in a processing chamber 4 which includes at least one target 40 with the materials to be sputtered. In case of the invention, Al and Si alloy targets with an Al:Si mixing ratio from 20:80 to 95:05 at %, preferably from 40:60 to 85:15 at %, and most preferably from 50:50 to 75:25 at % are used. The one or more targets are symbolized at 40. Process gas, typically argon (Ar), is admitted to processing chamber 4, so that a typical processing pressure ranging from $1.0\times10^{-3}$ to $5.0\times10^{-3}$ mbar is reached therein. A negative voltage is applied to the target to ignite a plasma in the processing chamber. Thereby, a sputtering process is initiated, which results in a transfer of material from the targets onto the substrate. Average power density in processing may be about 10 W/cm². The high power density sputtering process known as HiPIMS process or HPPMS process may also be applied. During sputtering, nitrogen (N) is supplied as a reactive gas in controlled manner, so that an AlSiN cover layer is formed on the substrate. In this procedure, the substrate may be repeatedly moved past the one or more targets until the desired layer thickness is achieved.

Then, the coated substrate is moved through lock-out chamber 5 which is ventilated after having been sealed from process chamber 4, after which the product is removed by removal device 6.

The diagram of FIG. 1 furthermore schematically shows a power supply and pulse unit 10 and a controller 11, used for the controlled supply of the voltage applied between the target and the substrate or the substrate holder. Further details of a sputtering apparatus are know to a person skilled in the art and are not shown in FIG. 1.

Figure 2:
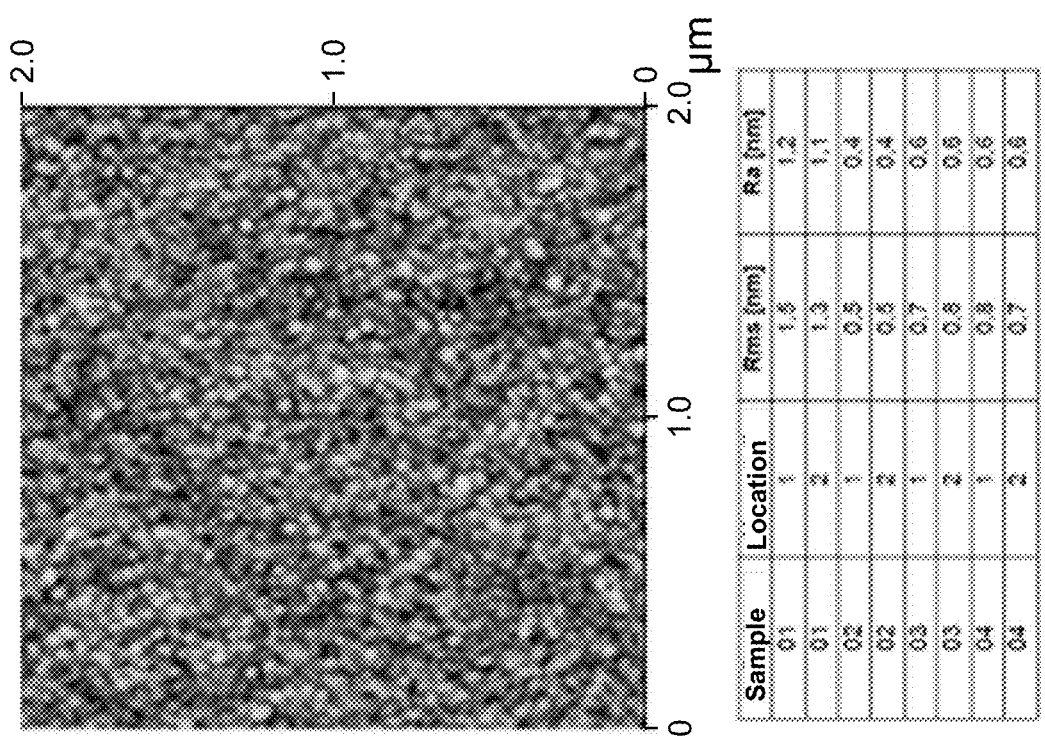
FIG. 2 shows a scanning micrograph of an enlarged detail of the cover layer according to the invention.

FIG. 2 shows a square detail of size 2 μm by 2 μm of the coated surface of an article according to the invention, in which the cover layer has an Al:Si ratio of about 50:50 at %. The light-dark values represent a scale from 10.0 nm to 0.0 nm. FIG. 2 includes a table with measured values of average roughness Ra [nm], ranging from 0.4 to 1.2 nm, and of root mean squared roughness RMS [nm], ranging from 0.5 to 1.5 nm. The measured values were obtained with an atomic force microscope (AFM). Thus, the layer has an extremely smooth and even topography. The smoother the layer, the fewer points of attack will stand against an external item, for example an abrasive particle. For this reason, smooth surfaces are more scratch-resistant than rough surfaces of the same surface hardness. The foreign body can easily slide off the smooth surface and will not get caught on an elevation or depression in the layer surface. Comparative tests have shown that a roughness of Ra>1.5 nm leads to a significant increase in the susceptibility to scratches. Therefore, in particular layers with a roughness of Ra<1.5 nm, better Ra<1.0 nm are particularly unsusceptible to scratches.

Figure 3:
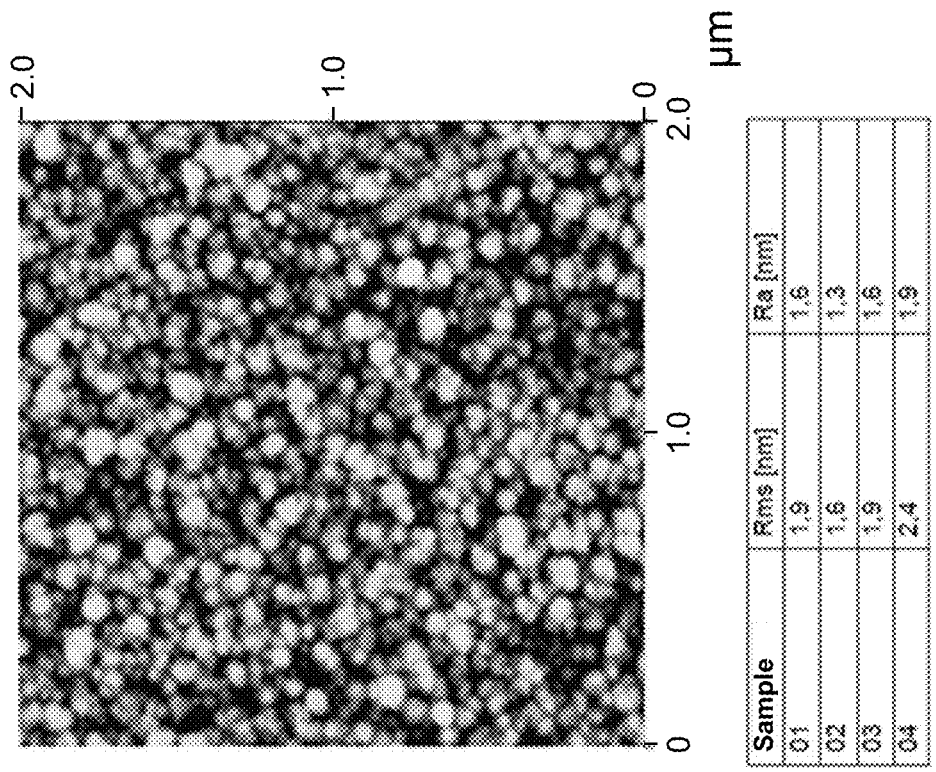
FIG. 3 shows a scanning micrograph of a prior art cover layer.

FIG. 3 shows a detail of size 2 μm by 2 μm of a comparison sample comprising an SiN layer with Al doping of 10 at %. This sample was also scanned with an atomic force microscope. The light-dark values represent a scale from 15.0 nm to 0.0 nm. Measured RMS roughness values and Ra roughness appear next to the topographical representation. Average roughness Ra ranges from 1.3 to 1.9 nm, and root mean squared roughness RMS ranges from 1.6 to 2.4 nm.

Figure 4:
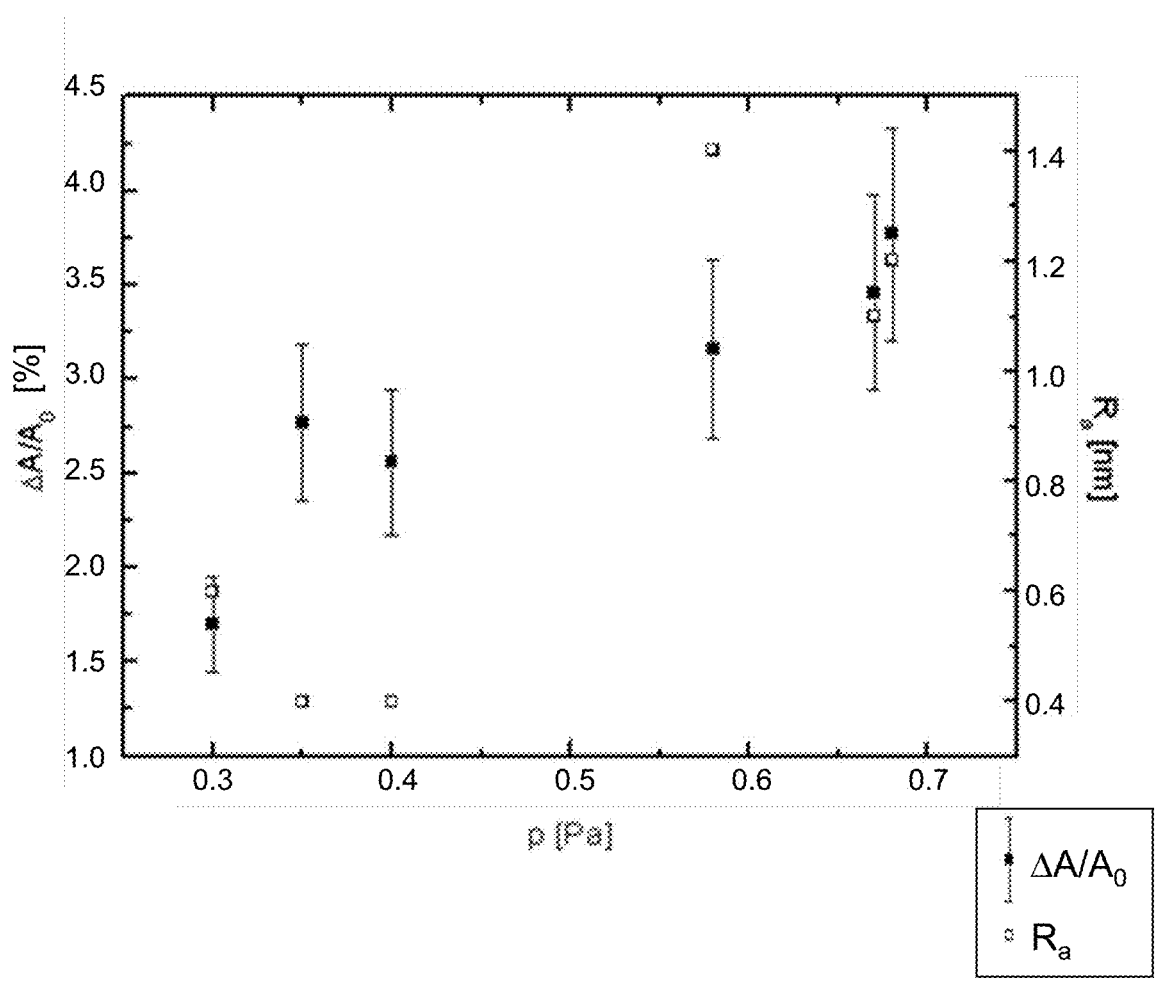
FIG. 4 illustrates a relationship between defect surface area and surface roughness in the cover layer according to the invention.

Roughness values furthermore affect the size of defect surface areas of the cover layers. FIG. 4 shows a relationship between defect surface area and roughness values of AlSiN cover layers with an Al:Si ratio of about 50:50 at %. The abscissa indicates the processing gas pressure p, in Pa, the left ordinate indicates the relative defect surface area $\Delta A/A_0$, in %, and the right ordinate indicates average roughness Ra, in nm. The graph shows that a low processing gas pressure is beneficial for achieving low roughness values.

Figure 5:
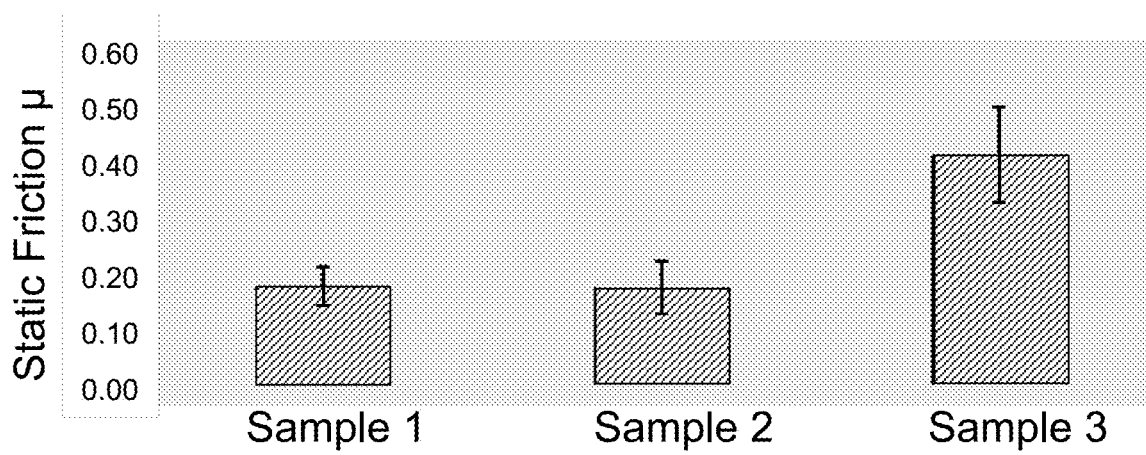
FIG. 5 illustrates static friction on glass ceramic, on an Al-doped SiN layer, and on a cover layer according to the invention.

For an application of the AlSiN cover layers in the field of cooktops it is important that the pots slide easily over the cooktop. Such pots are in particular made of stainless steel. FIG. 5 shows a bar chart of static friction μ with respect to stainless steel for different embodiments of cooktops. Sample 1 on the left refers to an uncoated glass ceramic, sample 2 in the middle to an AlSiN cover layer on glass ceramic, and sample 3 on the right to an SiN layer with 10 at % Al doping on glass ceramic. The bars represent the averages of a plurality of measurements. The diagram indicates that in the application field of cooktops aluminum-doped SiN coatings according to DE 10 2007 033 338 B4 are less favorable in terms of static friction than the coating according to the invention.

Another disadvantage of aluminum-doped SiN coatings when applied to cooktops is the risk of salted water burn-in in the cooktop. When salted water evaporates on the cooktop, the water breaks the bonds between Si and N, and SiO sites may be created where Na ions can attach. This leads to a noticeable undesired visual change of the SiN layer on the cooktop.

As mentioned above, the AlSiN coating according to the invention may comprise still further layer components. However, Al and Si predominate over optional further components. Without being limited to the illustrated exemplary embodiments, these layer components may comprise carbides and/or nitrides and/or carbonitrides and/or oxides of at least one of the elements boron, titanium, chromium, zirconium, hafnium, and carbon. In order to obtain the advantageous properties of the coating according to the invention, the content of these layer components preferably does not exceed ⅓ (so that Al and Si represent at least ⅔ of the nitridic and oxidic components). Preferably, these layer components comprise at most ¼, particularly preferably not more than 15% of the total molar content of Al and Si. In addition to the low static friction value of the layer according to the invention for stainless steel, the layer components mentioned above may advantageously also lower dynamic friction. Thus, wear protection is also improved.

Furthermore, carbides and carbonitrides may additionally be used to lower light transmittance.

Figure 6:
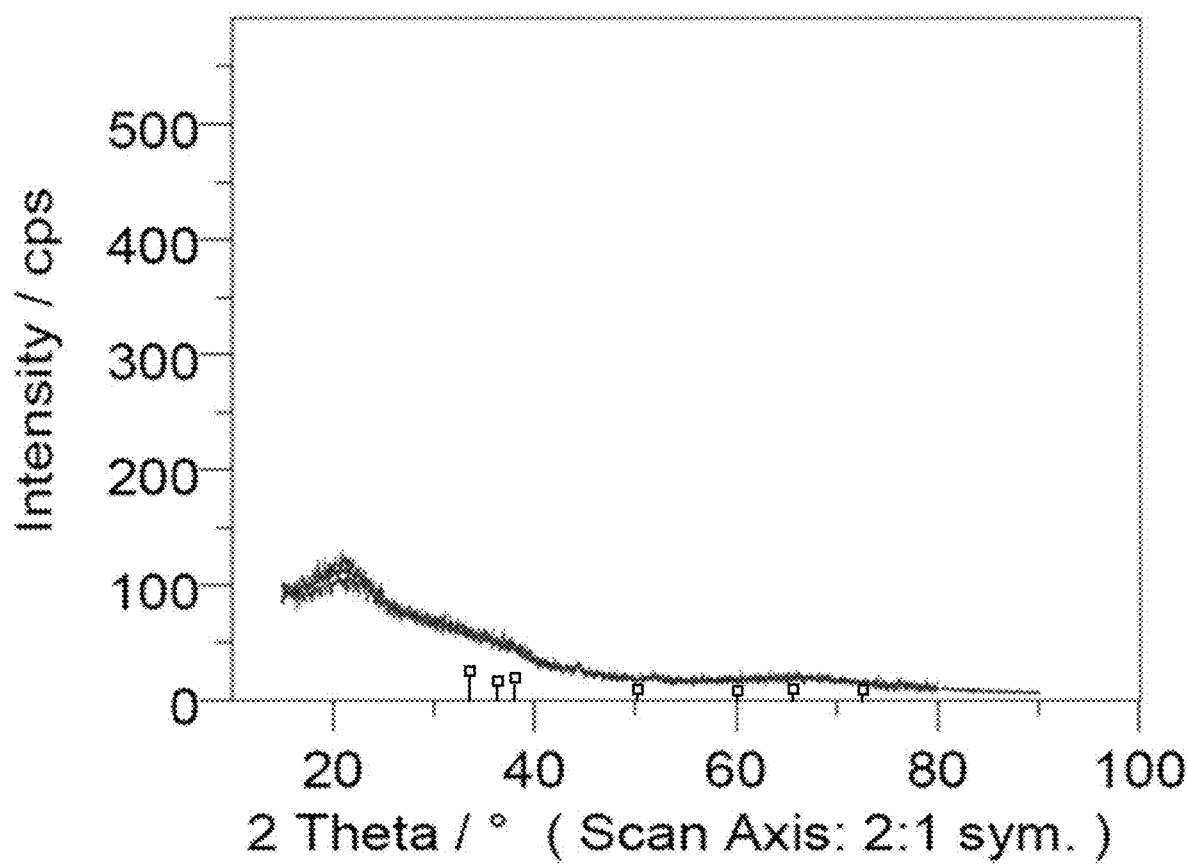
FIG. 6 shows X-ray diffraction diagrams of cover layers according to the invention.

What is moreover advantageous for achieving the low roughness values of the invention is the fact that the AlSiN layer is amorphous under the processing conditions according to the invention. This is proven by FIG. 6 which shows an X-ray diffraction profile. The angle of incidence of the X-ray beam corresponds to the (100) preferred orientation. The abscissa represents the opening angle of X-ray diffraction, 2 theta. The ordinate represents counts. The diagram further includes flags (vertical lines with square on top) which represent the theta positions of X-ray diffraction phenomena for AlN crystals, if those can be detected in the sample. Thus, if counts were increased at all positions marked with flags, one could assume that the sample contains AlN crystallites. However, FIG. 6 shows that with the processing conditions according to the invention it is possible to produce cover layers free of AlN crystallites. Thus, the cover layer according to the invention is furthermore X-ray amorphous. The extraordinary smoothness of the surface of the produced AlSiN cover layer is not least due to the absence of AlN crystallites.

Figure 7:
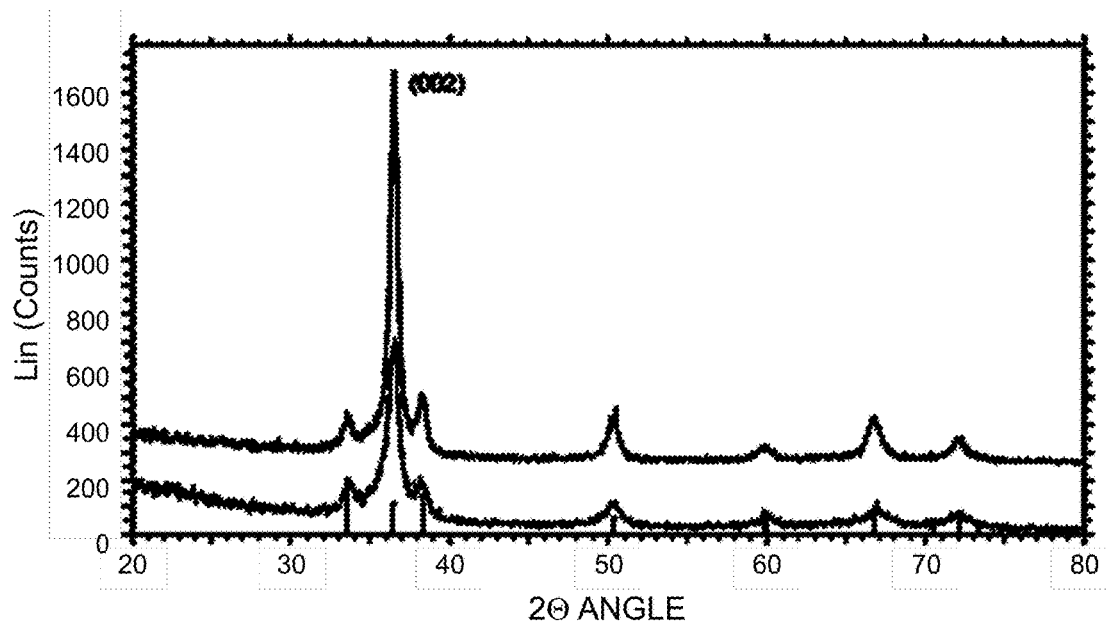
FIG. 7 shows X-ray diffraction diagrams of prior art layers.

FIG. 7 shows X-ray diffraction diagrams of crystalline/amorphous two-phase SiN/AlN cover layers as disclosed in EP 1 705 162 A1. Again, the 2 theta positions which have the highest counts when crystalline AlN is present are marked on the abscissa. The diagram shows that a crystalline AlN fraction can be detected in the samples.

Figure 8:
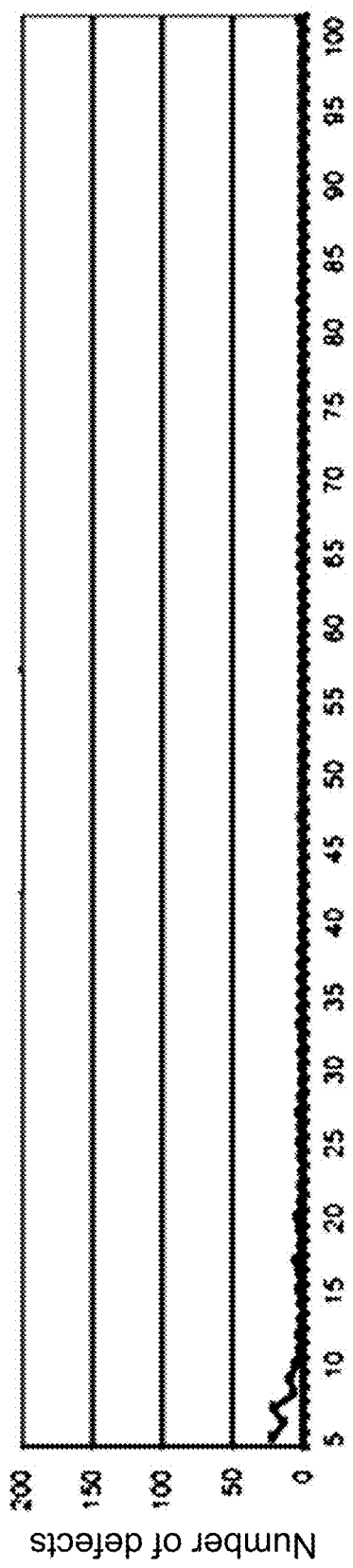
FIG. 8 shows a diagram of defect numbers in the cover layer according to the invention.
Figure 9:
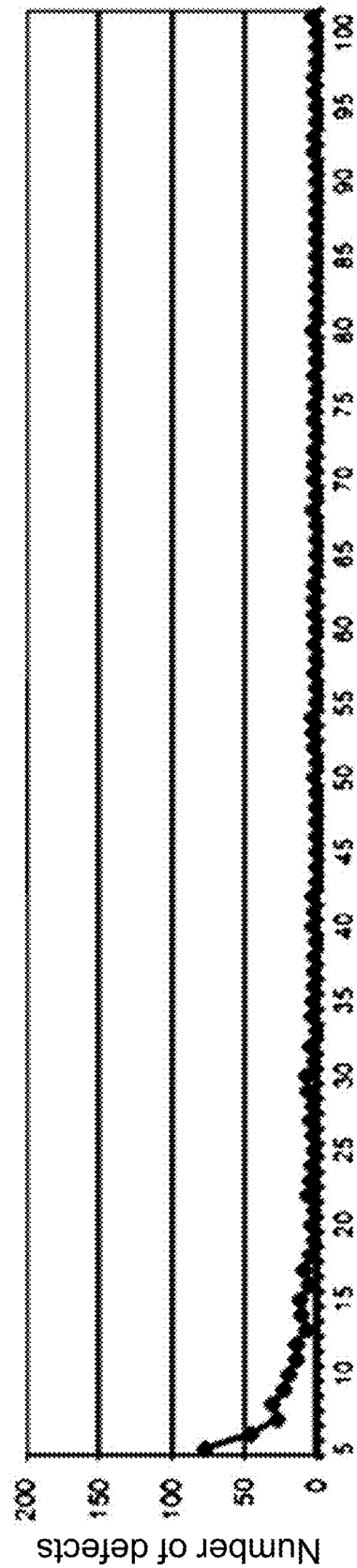
FIG. 9 shows a diagram of defect numbers in a prior art cover layer.

The low layer roughness of the AlSiN cover layer according to the invention leads to a low number of defects, classified according to defect sizes, after performing application tests. FIG. 8 illustrates the number of defects with regard to defect classes for the AlSiN cover layer according to the invention, and FIG. 9 is a similar representation for an aluminum-doped SiN layer with 10 at % Al doping. With about 25 defects of class size 5 and lacking defects beyond class size 12, the AlSiN cover layer according to the invention offers a much better scratch protection effect than the Al-doped SiN layer according to FIG. 9. In FIG. 9 there are about 80 defects of class size 5 and the number of defects only goes to zero at about class size 20.

The class size of defects corresponds to the surface area of the defects. In particular, the class size refers to the number of pixels of an evaluation camera. The pixels have a size of about 25 μm×25 μm. Accordingly, for example class size 5 includes defects with an edge length of up to 125 μm.

Figure 10:
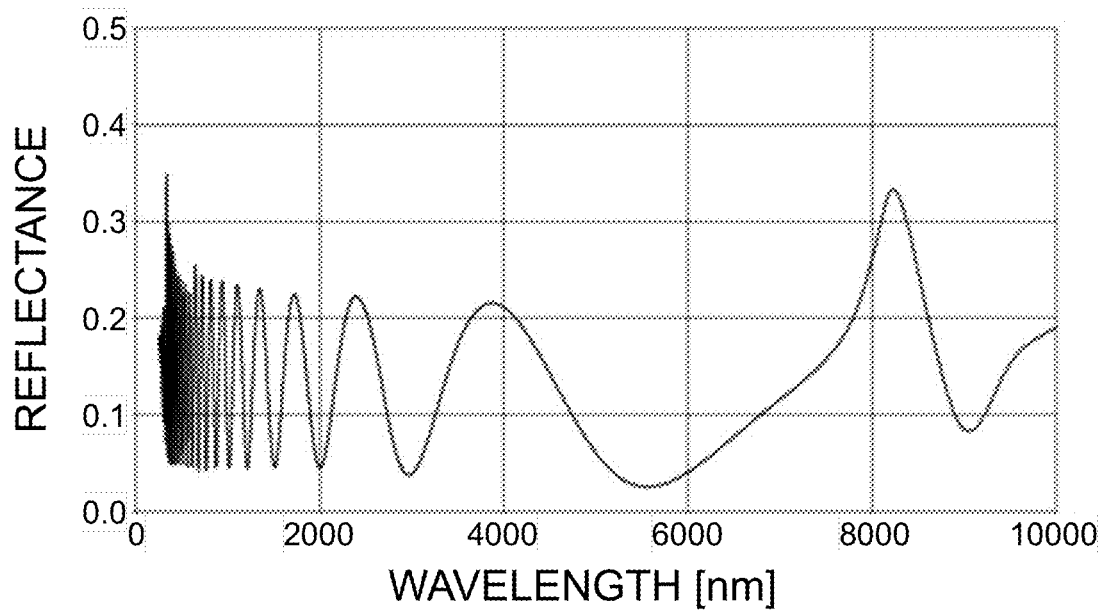
FIG. 10 shows a graph of spectral reflectance of a cover layer according to the invention.
Figure 11:
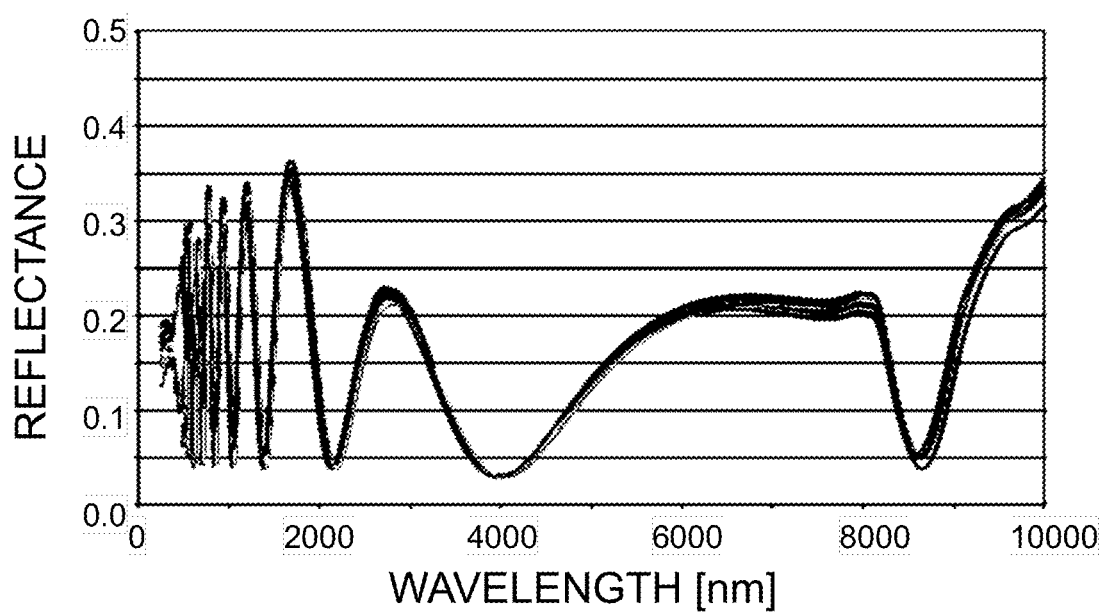
FIG. 11 shows a graph of the spectral reflectance of a prior art cover layer.

Cooktops often have a decoration printed thereon, which together with the black glass ceramic should be well visible through the cover layer. Therefore, it is desirable for the coating to reflect and absorb as little as possible in the visible spectrum. The refraction indices of the layer should be as small as possible. FIG. 10 shows the spectral reflectance for the AlSiN cover layer according to the invention over the wavelength in the visible and infrared spectrum of light, and FIG. 11 for an $Si_3N_4$ layer as disclosed in DE 10 2007 033 338 B4. The reflectance of the AlSiN layer according to the invention (FIG. 10) is generally lower than the reflectance of the prior art $Si_3N_4$ layer (FIG. 11), and is close to 0.2 in the peak values in the visible spectrum, whereas in case of FIG. 11 the peak values are partly at 0.30 and 0.35 in the visible spectrum. When producing a coating according to the invention, it is advantageous to use a substrate heater to bring the substrate to a higher temperature before or during coating, which facilitates the formation of a dense layer. The heating may be realized by means of simple radiant heaters. Alternatively, heating using pulsed processes like in flash lamp annealing may be useful. Further, lasers may be used which are matched to the layer material or the substrate, to heat the substrate before or during the coating to thereby positively influence the deposition of the layer.

The hardness and performance of the scratch protection of a layer according to the invention may also be improved by a treatment subsequent to the production thereof. Besides a simple thermal treatment in an oven, flash lamp heating or a laser treatment may be applied.

In summary it can be stated that the invention provides a scratch-resistant amorphous and transparent AlSiN cover layer, whose surface roughness is remarkably low, and which thereby has excellent sliding properties with respect to pots and other items. The cover layer is transparent in the visible light range and also largely transparent in the infrared range, and has good chemical resistance to salted water burn-in. If the cover layer is desired to exhibit lower light transmission, the AlSiN layer may additionally comprise carbides or carbonitrides of at least one of the elements boron, titanium, chromium, zirconium, and hafnium.

Figure 12:
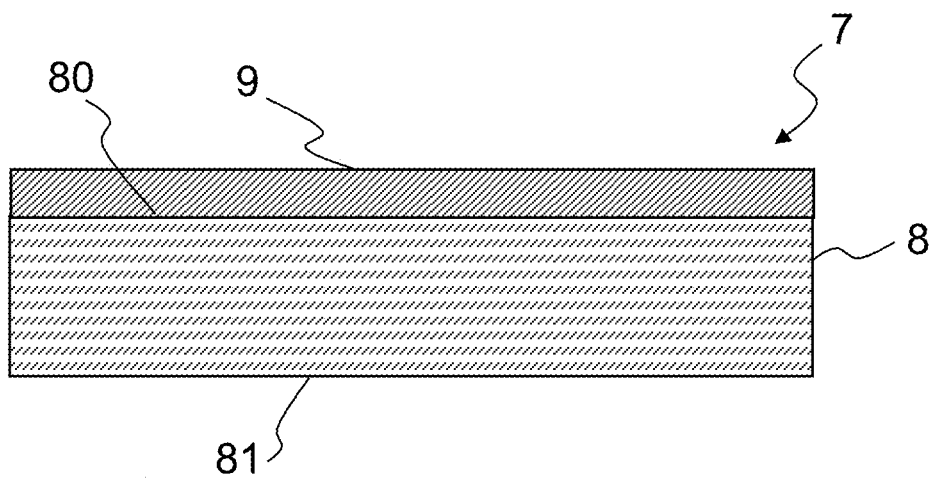
FIGS. 12 to 14 show different exemplary embodiments of coated glass articles according to the invention.

Some embodiments of glass articles according to the invention will be described below. FIG. 12 shows a basic embodiment of the invention in cross section. For a glass article 7 according to the invention, a flat or sheet-like glass or glass ceramic substrate 8 having surfaces 80, 81 is preferably used. On at least one of the surfaces, in the illustrated example on surface 80, an AlSiN cover layer 9 according to the invention is deposited. The layer thickness of AlSiN cover layer 9 is in a range from 0.5 μm to 5 μm, preferably from 0.5 μm to 2 μm. Preferably, at least one utilization surface is coated. Accordingly, in case of a glass article 7 in form of a glass ceramic plate of a glass ceramic cooktop, coated surface 80 would be the upper surface of the glass ceramic plate. In case of a glass article 7 in form of a display cover, for example for a touch screen, surface 80 with cover layer 9 accordingly is the outer surface of the cover facing the user.

Figure 13:
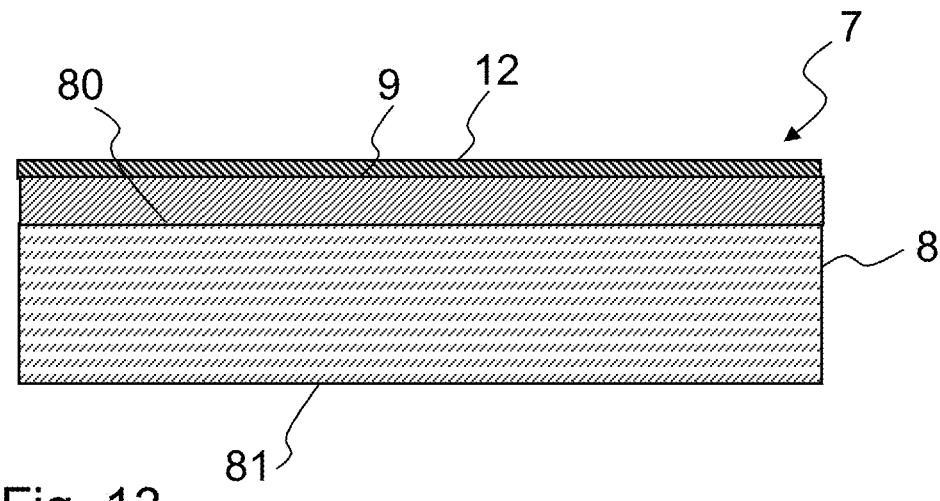

According to one embodiment of the invention, as shown in the example of FIG. 13, a final layer 12 may be provided in addition to cover layer 9. Final layer 12 is deposited on cover layer 9. In particular, final layer 12 may serve to modify the visual properties or friction properties. Suitable materials for the final layer are in particular one or more substances from a group comprising oxides, nitrides, carbonitrides, and oxynitrides of at least one of the elements aluminum, silicon, boron, zirconium, titanium, chromium, nickel.

Under certain circumstances, such a final layer 12 might even impair the mechanical properties of the coating as a whole, depending on the layer thickness thereof.

It is therefore preferred to keep this final layer 12 thin. Generally, without limitation to the illustrated exemplary embodiment, it is therefore contemplated according to one embodiment of the invention, that a final layer 12 is deposited on AlSiN cover layer 9, which has a layer thickness smaller than the layer thickness of AlSiN cover layer 9. Particularly preferably, the layer thickness of such a final layer 12 is in a range from 1 to 500 nanometers, most preferably in a range from 1 to 200 nanometers.

Figure 14:
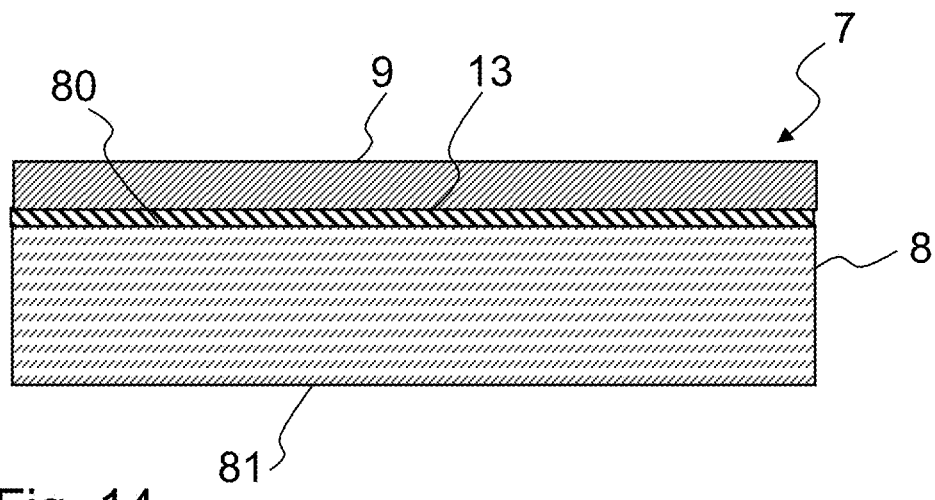

According to yet another embodiment, an intermediate layer 13 may be deposited. FIG. 14 shows a respective exemplary embodiment. The AlSiN cover layer is deposited on the previously deposited intermediate layer 13. The purpose of intermediate layer 13 is to improve the adhesion of cover layer 9. Intermediate layer 13 is preferably also kept thin. According to a refinement, intermediate layer 13 has a layer thickness in a range from 1 to 500 nanometers, preferably in a range from 1 to 200 nanometers, more preferably in a range from 1 to 50 nanometers. Like for final layer 12, suitable materials for the intermediate layer are in particular one or more substances from a group comprising oxides, nitrides, carbonitrides and oxynitrides of at least one of the elements aluminum, silicon, boron, zirconium, titanium, chromium, nickel.

LIST OF REFERENCE NUMERALS

1 Loading device
2 Lock-in chamber
3 Heating chamber
4 Processing chamber
5 Lock-out chamber
6 Removal device
7 Glass article
8 Substrate
9 Cover layer
10 Power supply and pulse unit
11 Controller
12 Final layer
13 Intermediate layer
40 Target
80, 81 Surfaces of 8

What is claimed is:

1. A cooktop plate comprising:
a glass-ceramic substrate, and
an AlSiN cover layer directly deposited on the substrate and in contact with the glass-ceramic to form a scratch resistant surface of the cooktop plate and exhibiting a surface roughness of less than 1.5 nm, wherein the cover layer has an Al:Si mixing ratio in a range from 50:50 to 75:25 atomic %, wherein the AlSiN cover layer is transparent to visible and infrared radiation and wherein the AlSiN cover layer is X-ray amorphous.

2. The cooktop plate of claim 1, wherein the surface roughness is less than 1.0 nm.

3. The cooktop plate of claim 1, wherein the cover layer exhibits a hardness of greater than 15 GPa.

4. The cooktop plate of claim 1, wherein the cover layer exhibits a hardness of greater than 25 GPa.

5. The cooktop plate of claim 1, wherein the cover layer exhibits a static friction with respect to metallic bodies of less than 0.25.

6. The cooktop plate of claim 1, wherein the cover layer exhibits an average reflectance of less than 0.15 in the visible range of light.

7. The cooktop plate of claim 1, wherein the cover layer has a thickness in a range from 0.5 µm to 5 µm.

8. The cooktop plate of claim 1, wherein the cover layer has a thickness in a range from 0.5 to 2 µm.

9. The cooktop plate of claim 1, wherein the cover layer includes at least one carbide, nitride, carbonitride, or oxide of at least one element selected from the group consisting of boron, titanium, chromium, zirconium, hafnium, and carbon.

10. The cooktop plate of claim 1, further comprising a final layer deposited on the cover layer, the final layer having a thickness smaller than a thickness of the cover layer, wherein the final layer includes one or more substances selected from the group consisting of oxides, nitrides, carbonitrides, and oxynitrides of at least one element selected from the group consisting of aluminum, silicon, boron, zirconium, titanium, chromium, and nickel.

11. A window plate for fireplaces, ovens, vehicles, aircrafts, or ships, comprising:
a glass-ceramic substrate, and
an AlSiN cover layer directly deposited on the substrate and in contact with the glass ceramic to form a scratch resistant surface of the window plate and exhibiting a surface roughness of less than 1.5 nm, wherein the cover layer has an Al:Si mixing ratio in a range from 50:50 to 75:25 atomic %, wherein the AlSiN cover layer is transparent to visible and infrared radiation and wherein the AlSiN cover layer is X-ray amorphous.

12. A cover plate for scanner cash registers or displays, comprising:
a glass-ceramic substrate, and
an AlSiN cover layer directly deposited on the substrate and in contact with the glass-ceramic to from a scratch resistant surface of the cover plate and exhibiting a surface roughness of less than 1.5 nm, wherein the cover layer has an Al:Si mixing ratio in a range from 50:50 to 75:25 atomic %, wherein the AlSiN cover layer is transparent to visible and infrared radiation and wherein the AlSiN cover layer is X-ray amorphous.

* * * * *